(12) United States Patent
Wu et al.

(10) Patent No.: US 12,176,337 B2
(45) Date of Patent: Dec. 24, 2024

(54) SEMICONDUCTOR DEVICES AND METHODS OF MANUFACTURING

(71) Applicant: Taiwan Semiconductor Manufacturing Co., Ltd., Hsinchu (TW)

(72) Inventors: Yi-Wen Wu, Xizhi (TW); Po-Yao Chuang, Hsinchu (TW); Meng-Liang Lin, Hsinchu (TW); Techi Wong, Zhubei (TW); Shih-Ting Hung, Sanchong (TW); Po-Hao Tsai, Taoyuan (TW); Shin-Puu Jeng, Po-Shan Village (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 183 days.

(21) Appl. No.: 17/869,968

(22) Filed: Jul. 21, 2022

(65) Prior Publication Data
US 2022/0359489 A1   Nov. 10, 2022

Related U.S. Application Data

(62) Division of application No. 16/902,017, filed on Jun. 15, 2020, now Pat. No. 11,430,776.

(51) Int. Cl.
*H01L 25/18* (2023.01)
*H01L 21/56* (2006.01)
(Continued)

(52) U.S. Cl.
CPC ............ *H01L 25/50* (2013.01); *H01L 21/568* (2013.01); *H01L 24/16* (2013.01); *H01L 24/24* (2013.01); *H01L 24/25* (2013.01); *H01L 25/18* (2013.01); *H01L 2224/0231* (2013.01); *H01L 2224/02331* (2013.01); *H01L 2224/0235* (2013.01); *H01L 2224/16145* (2013.01); *H01L 2224/24137* (2013.01); *H01L 2224/24155* (2013.01); *H01L 2224/2505* (2013.01); *H01L 2224/25171* (2013.01)

(58) Field of Classification Search
CPC .......... H01L 25/50; H01L 24/25; H01L 25/18
See application file for complete search history.

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

CN   102169841 A   8/2011
CN   107818956 A   3/2018
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

Packaged devices and methods of manufacturing the devices are described herein. The packaged devices may be fabricated using heterogeneous devices and asymmetric dual-side molding on a multi-layered redistribution layer (RDL) structure. The packaged devices may be formed with a heterogeneous three-dimensional (3D) Fan-Out System-in-Package (SiP) structure having small profiles and can be formed using a single carrier substrate.

20 Claims, 13 Drawing Sheets

(51) Int. Cl.
*H01L 23/00* (2006.01)
*H01L 25/00* (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,929,128 B1 * | 3/2018 | Cheng .................. H01L 21/565 |
| 2011/0186960 A1 | 8/2011 | Wu et al. |
| 2013/0062760 A1 * | 3/2013 | Hung .................. H01L 23/5389 |
| | | 257/738 |
| 2014/0185264 A1 | 7/2014 | Chen et al. |
| 2015/0115469 A1 | 4/2015 | Lee et al. |
| 2018/0076166 A1 | 3/2018 | Yu et al. |
| 2019/0279925 A1 | 9/2019 | Hsu et al. |
| 2019/0333893 A1 | 10/2019 | Yu et al. |
| 2020/0411443 A1 | 12/2020 | Guo et al. |

FOREIGN PATENT DOCUMENTS

| | | |
|---|---|---|
| TW | 201939678 A | 10/2019 |
| TW | 202017132 A | 5/2020 |

\* cited by examiner

SEMICONDUCTOR DEVICES AND METHODS OF MANUFACTURING

PRIORITY CLAIM AND CROSS-REFERENCE

This application is a divisional of U.S. patent application Ser. No. 16/902,017, now U.S. Pat. No. 11,430,776, issued Aug. 30, 2022, entitled "Semiconductor Devices and Methods of Manufacturing," filed on Jun. 15, 2020, which application is hereby incorporated by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages. As the demand for shrinking electronic devices has grown, a need for smaller and more creative packaging techniques of semiconductor dies has emerged. An example of such packaging systems is System-in-Package (SiP) technology. In a SiP device, a plurality of heterogeneous semiconductor dies can be integrated into a single chip carrier package that can perform most or all of the functions of the device. As such, a complete functional unit can be built in a multi-chip package using SiP technology to provide a high level of integration and component density which enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
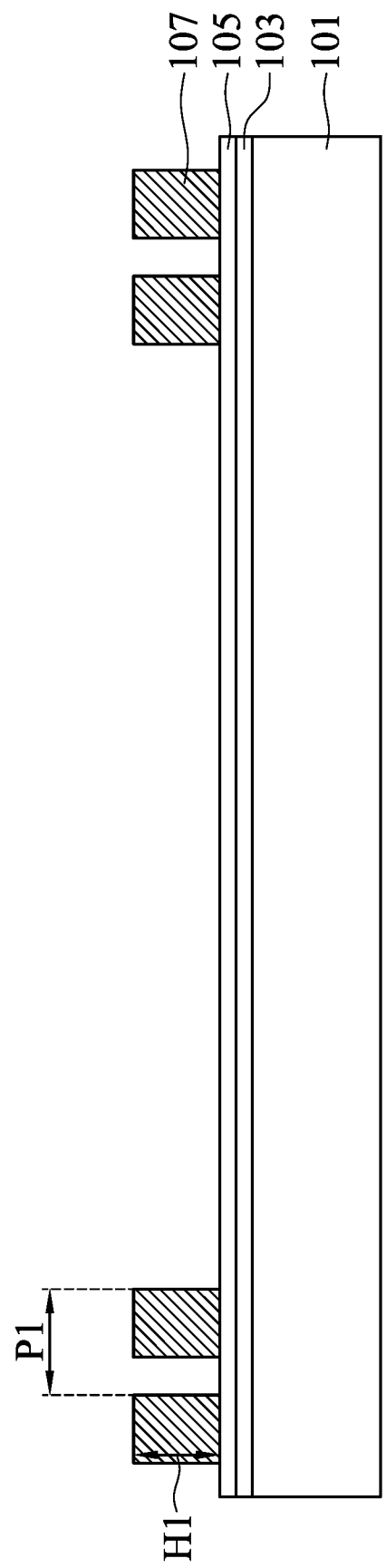
FIG. 1 illustrates forming through integrated fan-out vias over a carrier substrate in an intermediate step of forming a System-in-Package (SiP) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a device package and the formation thereof are described. The device package may be, for example, a System-in-Package (SiP) device. In some embodiments, the system-in-package device may integrate heterogeneous dies integrated on opposing sides of a redistribution structure in a face-to-face arrangement. According to some embodiments, the System-in-Package (SiP) device may be formed using a single carrier substrate in a chip-first process flow. According to some embodiments, a first set of heterogeneous dies may be bonded to a first side of the redistribution structure and embedded within a first molding compound and a second set of heterogeneous dies may be bonded to a second side of the redistribution structure and embedded within a second molding compound. The redistribution structure may comprise multiple redistribution layers and first and second molding compounds may be formed from different molding materials and to different heights, in accordance with some embodiments. As such, the System-in-Package (SiP) device may be formed as an asymmetric dual-sided molded package on a multi-layered RDL structure. In some embodiments, an integrated redistribution layer (e.g., a fan-out structure) is formed over a system-on-chip (SoC) component and is integrated into the System-in-Package (SiP) device. Such methods of integrating heterogeneous dies within a System-in-Package (SiP) device allow for a high level of integration and component density and provide for a low cost SiP process flow which enables production of semiconductor devices with enhanced functionalities and small footprints on a printed circuit board (PCB).

With respect to particular embodiments, FIGS. 1 through 8B illustrate cross-sectional views of intermediate steps of forming a heterogeneous three-dimensional (3D) Fan-Out die package (e.g., System-in-Package (SiP)). In particular, FIG. 1 illustrates a carrier substrate 101, a release layer 103 formed on the carrier substrate 101 and a front-side dielectric layer 105 formed on the release layer 103.

The carrier substrate 101 may be a glass carrier substrate, a ceramic carrier substrate, or the like. The carrier substrate 101 may be a wafer, such that multiple packages can be formed on the carrier substrate 101 simultaneously. The release layer 103 may be formed of a polymer-based material, which may be removed along with the carrier substrate 101 from the overlying structures that will be formed in subsequent steps. In some embodiments, the release layer 103 is an epoxy-based thermal-release material, which loses its adhesive property when heated, such as a light-to-heat-conversion (LTHC) release coating. In other embodiments, the release layer 103 may be glue, such as ultra-violet (UV) glue, which loses its adhesive property when exposed to UV lights. The release layer 103 may be dispensed as a liquid and cured, may be a laminate film laminated onto the carrier substrate 101, or the like. The top surface of the release layer 103 may be leveled and may have a high degree of coplanarity.

The front-side dielectric layer 105 is formed on the release layer 103. The bottom surface of the front-side dielectric layer 105 may be in contact with the top surface of the release layer 103. In some embodiments, the front-side dielectric layer 105 is formed of a polymer, such as polybenzoxazole (PBO), polyimide, benzocyclobutene (BCB), or the like. In other embodiments, the front-side dielectric layer 105 is formed of a nitride such as silicon nitride; an oxide such as silicon oxide, phosphosilicate glass (PSG), borosilicate glass (BSG), boron-doped phosphosilicate glass (BPSG), or the like. The front-side dielectric layer 105 may be formed by any acceptable deposition process, such as spin coating, chemical vapor deposition (CVD), laminating, a combination thereof, or the like.

Further illustrated in FIG. 1, TIVs 107 (e.g., Through Integrated Fan-Out Vias (TIVs)) are formed over the front-side dielectric layer 105. As an example to form the TIVs 107, a seed layer (not shown) is formed over the front-side dielectric layer 105. In some embodiments, the seed layer is a metal layer, which may be a single layer or a composite layer comprising a plurality of sub-layers formed of different materials. For example, the seed layer may comprise titanium, copper, molybdenum, tungsten, titanium nitride, titanium tungsten, combinations thereof, or the like. In some embodiments, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the TIVs 107. The patterning forms openings through the photoresist exposing the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the TIVs 107. According to some embodiments, the TIVs 107 are formed to a first height H1 of between about 100 μm and about 250 μm, such as about 120 μm and have a first pitch P1 of between about 80 μm and about 250 μm, such as about 100 μm. However, any suitable heights and pitches may be used.

Figure 2:
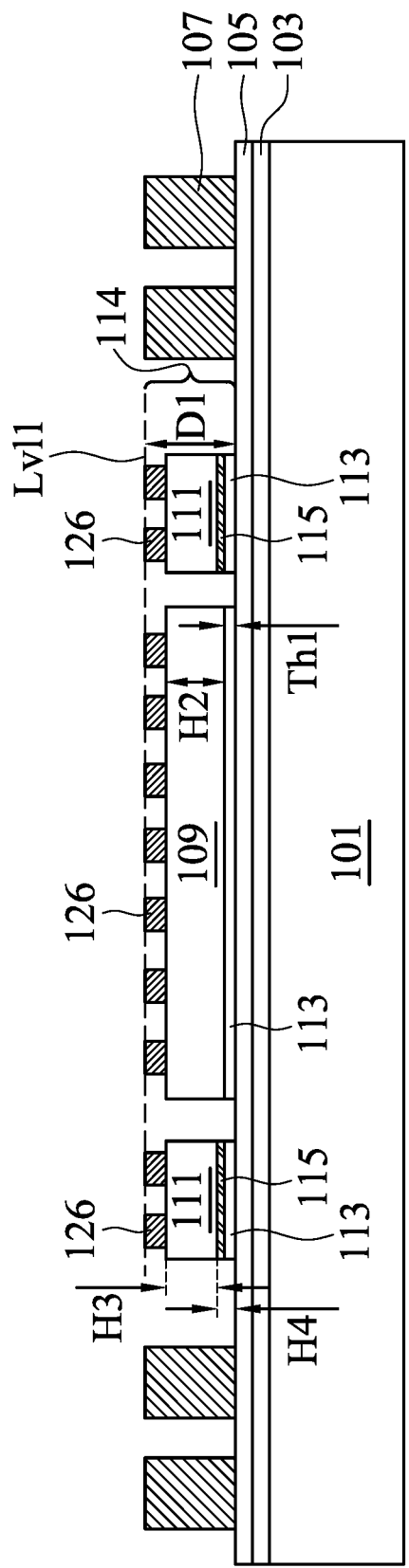
FIG. 2 illustrates placement of integrated circuit dies over the carrier substrate in an intermediate step of forming the System-in-Package (SiP) device, in accordance with some embodiments.

FIG. 2 illustrates integrated circuit dies 114 that are adhered to a top surface of the front-side dielectric layer 105. According to some embodiments, the integrated circuit dies 114 may comprise a heterogeneous group of dies such as a system-on-chip (SoC) and one or more integrated passive device (IPD) dies. However, the integrated circuit dies 114 may be other types of dies such as, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the front-side dielectric layer 105, the integrated circuit dies 114 may be processed according to applicable manufacturing processes to form and embed integrated circuits within the dies. Initially, the integrated circuit dies 114 may be formed in a wafer which may include different device regions that are tested and singulated in subsequent steps to form a plurality of known-good-dies (KGD). For example, the integrated circuit dies 114 each include internal components including semiconductor substrates, integrated circuits, active devices, passive devices, dielectric layers, conductive redistribution features, interconnect structures, passivation layers and/or packaging materials such as, encapsulant, molding compounds, or the like, for embedding the internal components. The integrated circuit dies 114 each further comprise die connectors 126 for external connection to the integrated circuit dies 114. The die connectors 126, such as conductive pillars, comprise a metal (e.g., copper) and are mechanically and electrically connected to the internal components of the integrated circuit dies 114. Once formed, the integrated circuit dies 114 may be tested and identified as the known-good-dies (KGD).

According to some embodiments, the integrated circuit dies 114 may be a heterogeneous group of dies comprising, for example, a first component 109 (e.g., a system-on-chip (SoC)) having a second height H2 and one or more second components 111 (e.g., an integrated passive device (IPD)) having a third height H3. According to some embodiments, the second height H2 of the first component 109 is between about 70 µm and about 150 µm, such as about 100 µm and the third height H3 of the one or more second components 111 is between about 50 µm and about 100 µm, such as about 80 µm.

Additionally, in embodiments in which the third height H3 (e.g., the height of the one or more second components 111) are less than the second height H2 (e.g., the height of the first component 109, a dam 115 may be added to the backside of the one or more second components 111 in order to reduce any differences in height between the one or more second components 111 and the first component 109. By reducing the differences in heights, any damage that results from stresses in subsequent manufacturing processes can be reduced or eliminated.

In a particular embodiment the dam 115 may be formed from a solid material such as a semiconductor material like silicon. Additionally, the dam 115 may be formed to a fourth height H4 that reduces the height difference between the one or more second components 111 and the first component 109, such as by being between about 20 µm and about 50 µm, such as about 20 µm. However, any suitable material and any suitable heights may be utilized.

The adhesive 113 adheres each of the integrated circuit dies 114 to the front-side dielectric layer 105, such as between the TIVs 107 as illustrated in FIG. 2. The adhesive 113 may be any suitable adhesive, epoxy, die attach film (DAF), or the like. According to some embodiments, the integrated circuit dies 114 are attached to the front-side dielectric layer 105 using a die attach film. The die attach film may be an epoxy resin, a phenol resin, acrylic rubber, silica filler, or a combination thereof, and is applied using a lamination technique. However, any other suitable material and any suitable methods may be used to adhere the integrated circuit dies 114 to the front-side dielectric layer 105 may also be utilized. In some embodiments, the adhesive 113 may be applied to a back-side of the integrated circuit dies 114 or may be applied over the surface of the front-side dielectric layer 105. The integrated circuit dies 114 may be singulated from a wafer, such as by sawing or dicing, and adhered to the front-side dielectric layer 105 by the adhesive 113 using, for example, a pick-and-place tool.

According to some embodiments in which one or more of the integrated circuit dies 114 are adhered to the front-side dielectric layer 105 by the adhesive 113 in the form of a die attach film, a leveling process may be performed to align the tops of the die connectors 126 at a first level Lvl1. For example, a leveling film (e.g., leveling foil or the like) may be placed in contact with the die connectors 126 and the upper surfaces of the integrated circuit dies 114. Once placed, a flattening tool may be used to apply a downward pressure to the integrated circuit dies 114 while a process temperature is raised to at or above a melting point of the die attach film. As such, the die attach film is compressed allowing the die connectors 126 of the integrated circuit dies 114 to align at the first level Lvl1 that is a first distance D1 from the front-side dielectric layer 105. According to some embodiments, the process temperature is between about 50° C. and about 200° C., such as about 110° C. and the first distance D1 is between about 105 µm and about 195 µm, such as about 135 µm. However, any suitable temperatures and distances may be used.

Figure 3:
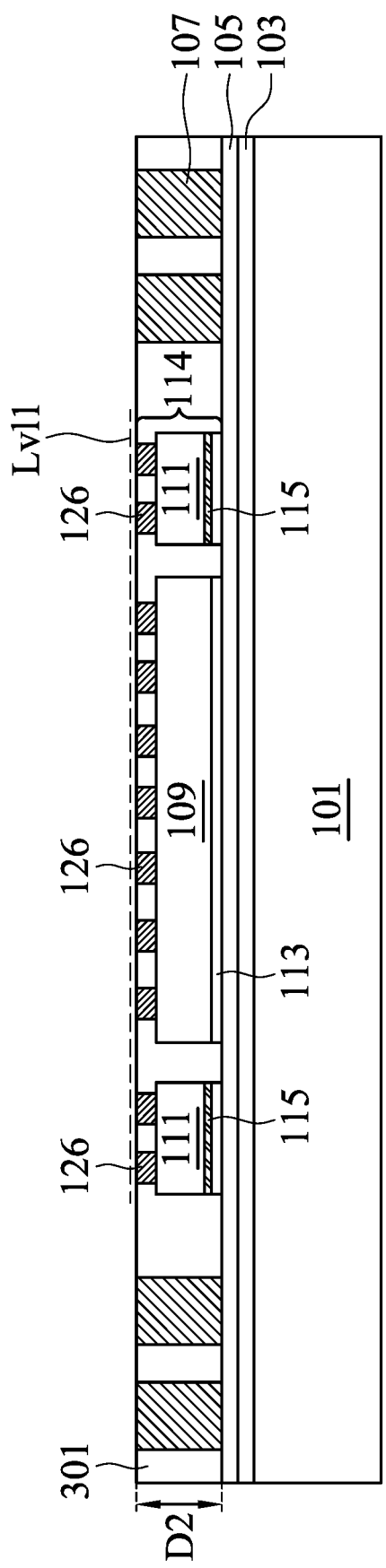
FIG. 3 illustrates encapsulation of the integrated circuit dies over the carrier substrate in an intermediate step of forming the System-in-Package (SiP) device, in accordance with some embodiments.

In FIG. 3, a first encapsulant 301 is placed over the front-side dielectric layer 105 to a level at or above the first level Lvl1 and encapsulates the TIVs 107 and the integrated circuit dies 114. The first encapsulant 301 may be a molding compound, epoxy, or the like, and may be applied by compression molding, transfer molding, or the like. According to some embodiments, the first encapsulant 301 has a first coefficient of thermal expansion CTE1, below a glass transition temperature of the first encapsulant 301, and has a second coefficient of thermal expansion CTE2, at or above the glass transition temperature of the first encapsulant 301. According to some embodiments, the first encapsulant 301 has a first coefficient of thermal expansion CTE1 of between about 6 ppm/K and about 20 ppm/K, such as about 10 ppm/K below a glass transition temperature of between about 147° C. and about 153° C., such as about 150° C. According to some embodiments, the first encapsulant 301 has a second coefficient of thermal expansion CTE2 of between about 30 ppm/K and about 50 ppm/K, such as about 41 ppm/K at or above the glass transition temperature of between about 147° C. and about 153° C., such as about 150° C. However, other suitable coefficients of thermal expansion may be used. After curing, the first encapsulant 301 can undergo a grinding process to expose the TIVs 107 and die connectors 126. After the grinding process, top surfaces of the TIVs 107, the die connectors 126, and the first encapsulant 301 are coplanar at a second distance D2 from the front-side dielectric layer 105. According to some embodiments, the second distance D2 is between about 105 µm and about 195 µm, such as about 135 µm. However, any suitable distance may be used. In some embodiments, the grinding may be omitted, for example, if the first encapsulant 301 is placed at the first level1 and the TIVs 107 and die connectors 126 are already exposed.

Figure 4A:
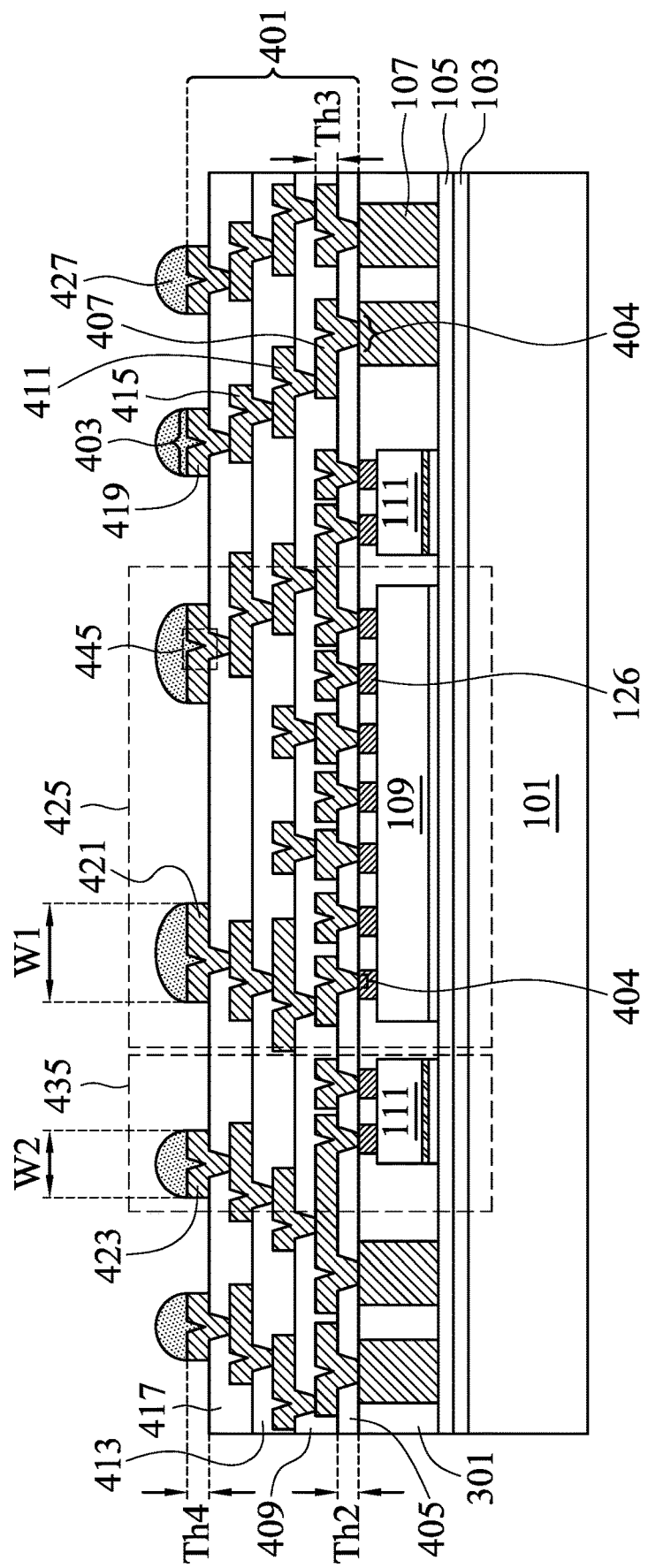
FIG. 4A illustrates the formation of a front-side redistribution structure and conductive connectors over the structure of FIG. 3 in an intermediate step of forming the System-in-Package (SiP) device, in accordance with some embodiments.

FIG. 4A illustrates the formation of a front-side redistribution structure 401 and conductive connectors 427. The front-side redistribution structure 401 includes dielectric layers and metallization patterns. The metallization patterns and dielectric layers may also be referred to as redistribution layers or redistribution lines. The front-side redistribution structure 401 is shown as an example comprising four dielectric layers (e.g., 405, 409, 413, and 417) and four metallization patterns (e.g., 407, 411, 415, and 419). More or fewer dielectric layers and metallization patterns may be formed in the front-side redistribution structure 401. If fewer dielectric layers and metallization patterns are to be formed, steps and process discussed below may be omitted. If more dielectric layers and metallization patterns are to be formed, steps and processes discussed below may be repeated. The front-side redistribution structure 401 may also be referred to herein as an integrated fan-out (InFO) structure.

According to some embodiments, the front-side redistribution structure 401 may be formed by initially forming a first dielectric layer 405 over the coplanar surfaces of the first encapsulant 301, the TIVs 107, and the die connectors 126. In some embodiments, the first dielectric layer 405 is formed of a polymer, which may be a photo-sensitive material such as PBO, polyimide, BCB, or the like, that may be patterned using a lithography mask. In other embodiments, the first dielectric layer 405 is formed of a nitride such as silicon nitride; an oxide such as silicon oxide, PSG, BSG, BPSG; or the like. The first dielectric layer 405 may be formed by spin coating, lamination, CVD, the like, or a combination thereof. According to some embodiments, the first dielectric layer 405 is deposited to a second thickness Th2 of between about 4 μm and about 12 μm, such as about 7 μm. However, any suitable thickness may be used. Once deposited, the first dielectric layer 405 is then patterned. The patterning forms openings exposing portions of the die connectors 126 of the integrated circuit dies 114 and the TIVs 107. The patterning may be by an acceptable process, such as by exposing the first dielectric layer 405 to light and developed when the first dielectric layer 405 is a photosensitive material. In embodiments where the first dielectric layer 405 is a nitride, the patterning may be performed using any suitable processes, such as etchings using, for example, an anisotropic etch to form the openings.

The first metallization pattern 407 is then formed on and extends along the major surface of the first dielectric layer 405 and conforms to sidewalls of the openings extending through the first dielectric layer 405. As such, the first metallization pattern 407 comprises a plurality of flat surface contact areas 404 that are physically and electrically coupled to the die connectors 126 of the integrated circuit dies 114. As an example to form the first metallization pattern 407, a seed layer (not shown) may be formed over the first dielectric layer 405 and in the openings extending through the first dielectric layer 405. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the first metallization pattern 407. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the first metallization pattern 407. According to some embodiments, the first metallization pattern 407 may be deposited to a third thickness Th3 of between about 2 μm and about 8 μm, such as about 4 μm. However, any suitable thickness may be used. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Once the first metallization pattern 407 has been deposited, the second dielectric layer 409 is deposited on the first metallization pattern 407 and the first dielectric layer 405. As such, uppermost portions of the first metallization pattern 407 are embedded in the second dielectric layer 409. The second dielectric layer 409 may be formed in a manner similar to the first dielectric layer 405, and may be formed of a similar material and to a similar thickness (e.g., the second thickness Th2) as the first dielectric layer 405. However, any suitable material and thickness may be used. Once deposited, openings are formed in the second dielectric layer 409 exposing areas of the first metallization pattern 407. The openings in the second dielectric layer 409 may be formed using any patterning process suitable for forming the openings in the first dielectric layer 405 (e.g., exposing and developing a photo-sensitive material, etching a nitride material, or the like).

Once the openings have been formed in the second dielectric layer 409, the second metallization pattern 411 is then formed. The second metallization pattern 411 is deposited on and extends along the major surface of the second dielectric layer 409 and conforms to the openings in the second dielectric layer 409 extending through the second dielectric layer 409 to physically and electrically couple to the first metallization pattern 407. The second metallization pattern 411 may be formed in a manner similar to the first metallization pattern 407, and may be formed of a similar material and to a similar thickness (e.g., the third thickness Th3) as the first metallization pattern 407. However, any suitable material and thickness may be used. In some embodiments, the second metallization pattern 411 has a different size than the first metallization pattern 407. For example, the second metallization pattern 411 may be wider or thicker than the first metallization pattern 407. Furthermore, the portions of the second metallization pattern 411 conforming to the openings in the second dielectric layer 409 may be formed to a different pitch than the portions of the first metallization pattern 407 conforming to the openings in the first dielectric layer 405. However, the second metallization pattern 411 may be formed using any materials, and any processes suitable for forming the first metallization pattern 407 and the second metallization pattern 411 may be formed to any widths and/or thicknesses suitable for forming the first metallization pattern 407, as set forth above.

Once the second metallization pattern 411 has been deposited, the third dielectric layer 413 is deposited on the second metallization pattern 411 and the second dielectric layer 409. The third dielectric layer 413 may be formed in a manner similar to the first dielectric layer 405, and may be formed of a similar material and to a similar thickness (e.g., the second thickness Th2) as the first dielectric layer 405. Once the third dielectric layer 413 has been formed, openings may be formed in the third dielectric layer 413 to expose areas of the second metallization pattern 411 and the openings may be formed using any patterning process suitable for forming the openings in the first dielectric layer 405.

The third metallization pattern 415 is then formed on and extends along the major surface of the second dielectric layer 409 and conforms to the openings in the third dielectric layer 413 to physically and electrically couple to the second metallization pattern 411. The third metallization pattern 415 may be formed using any materials, and any processes suitable for forming the first metallization pattern 407. The third metallization pattern 415 may be formed to a similar thickness (e.g., the third thickness Th3) as the first metallization pattern 407. However, any suitable material and thickness may be used. In some embodiments, the third metallization pattern 415 has a different size than the second metallization pattern 411. For example, the third metallization pattern 415 may be wider or thicker than the second metallization pattern 411. In some embodiments, the third metallization pattern 415 has a different size than either the first metallization pattern 407 and/or the second metallization pattern 411. Furthermore, the portions of the third metallization pattern 415 conforming to the openings in the third dielectric layer 413 may be formed to a different pitch than the portions of the second metallization pattern 411 conforming to the openings in the second dielectric layer 409, according to some embodiments.

Once the third metallization pattern 415 has been deposited, the fourth dielectric layer 417 is deposited on the third metallization pattern 415 and the third dielectric layer 413. The fourth dielectric layer 417 may be formed in a manner similar to the first dielectric layer 405, and may be formed of a similar material using similar processes and may be formed to a similar thickness (e.g., the second thickness Th2) as the first dielectric layer 405. Once formed, openings may be formed in the fourth dielectric layer 417 to expose areas of the third metallization pattern 415 and the openings may be formed using any patterning process suitable for forming the openings in the first dielectric layer 405.

According to some embodiments, the fourth metallization pattern 419 is formed over and extends along the major surface of the fourth dielectric layer 417 and conforms to the openings in the fourth dielectric layer 417 to physically and electrically couple to the third metallization pattern 415. The fourth metallization pattern 419 may be formed using any materials and processes suitable for forming the first metallization pattern 407. Furthermore, the fourth metallization pattern 419 may be formed to any suitable thickness (e.g., a fourth thickness Th4) of between about 10 µm to about 40 µm, such as about 30 µm. In some embodiments, the fourth metallization pattern 419 has a different size than any of the first metallization pattern 407, the second metallization pattern 411 and/or the third metallization pattern 415. Furthermore, the portions of the fourth metallization pattern 419 conforming to the openings in the fourth dielectric layer 417 may be formed to a different pitch than the portions of the third metallization pattern 415 conforming to the openings in the third dielectric layer 413. The fourth metallization pattern 419, in some embodiments, is a desired topmost metallization layer of the front-side redistribution structure 401.

FIG. 4A further illustrates that the topmost metallization layer of the front-side redistribution structure 401 comprises a plurality of bumping areas 403. The plurality of bumping areas 403 may have the same widths or may have different widths. According to some embodiments, the plurality of bumping areas 403 comprises a first bumping area 421 having a first width W1. The first bumping area 421 may be disposed in a first region 425 over the first component 109 (e.g., the system-on-chip (SoC)) of the integrated circuit dies 114. In some embodiments, the first width W1 is between about 300 µm and about 550 µm, such as about 300 µm. However, any suitable width may be used.

According to some embodiments, the plurality of bumping areas 403 comprises a second bumping area 423 having a second width W2. The second bumping area 423 may be disposed in a second region 435 over one of the second components 111 (e.g., one of the integrated passive device (IPD)) of the integrated circuit dies 114. In some embodiments, the second width W2 is between about 150 µm and about 300 µm, such as about 200 µm. However, any suitable width may be used.

In another embodiment, the topmost metallization layer of the front-side redistribution structure 401 may either be capped by a plurality of Under Bump Metallizations (UBM) (not separately illustrated) or else be replaced by the plurality of UBMs. In this embodiment, the Under Bump Metallizations (UBM) comprise a metal seed layer, which may be a single layer or a composite layer comprising a plurality of sub-layers formed of different materials (e.g., a titanium layer and a copper layer over the titanium layer) using, for example, a physical vapor deposition (PVD) process or the like, while conductive materials are formed on the metal seed layer. Once the seed layer has been formed, a photoresist may be deposited by spin coating or the like and then patterned (e.g., by exposing to light) such that openings in the photoresist correspond to the desired placement of the UBMs. Once the photoresist has been patterned, the conductive material is formed in the openings of the photoresist corresponding to the UBM. The conductive material comprises a metal (e.g., copper, titanium, tungsten, aluminum, alloys thereof, combinations thereof, or the like) and may be formed by plating (e.g., electroplating or electroless plating, or the like). Then, the photoresist is removed (e.g., via ashing or stripping process, such as using an oxygen plasma or the like) and exposed portions of the seed layer (if provided) not covered by the conductive material are removed (e.g., by using an acceptable etching process, such as by wet or dry etching). As such, the Under Bump Metallizations (UBM) are formed over and through patterned openings in the topmost dielectric layer (e.g., the fourth dielectric layer 417) and in contact with an underlying metallization pattern (e.g., the third metallization pattern 415).

FIG. 4A further illustrates conductive connectors 427 formed over the bumping areas 403 of the topmost metallization pattern (e.g., the fourth metallization pattern 419) of the front-side redistribution structure 401. Once the topmost metallization layer has been formed, a pre-solder printing process may be performed on the bumping areas 403 of the topmost metallization pattern. According to some embodiments, the conductive connectors 427 are formed over and fill the joint pad shape 445 of the bumping areas 403.

The conductive connectors 427 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 427 may include a conductive material such as solder, copper, aluminum, gold, nickel, silver, palladium, tin, the like, or a combination thereof. In some embodiments, the conductive connectors 427 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 427 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 4B:
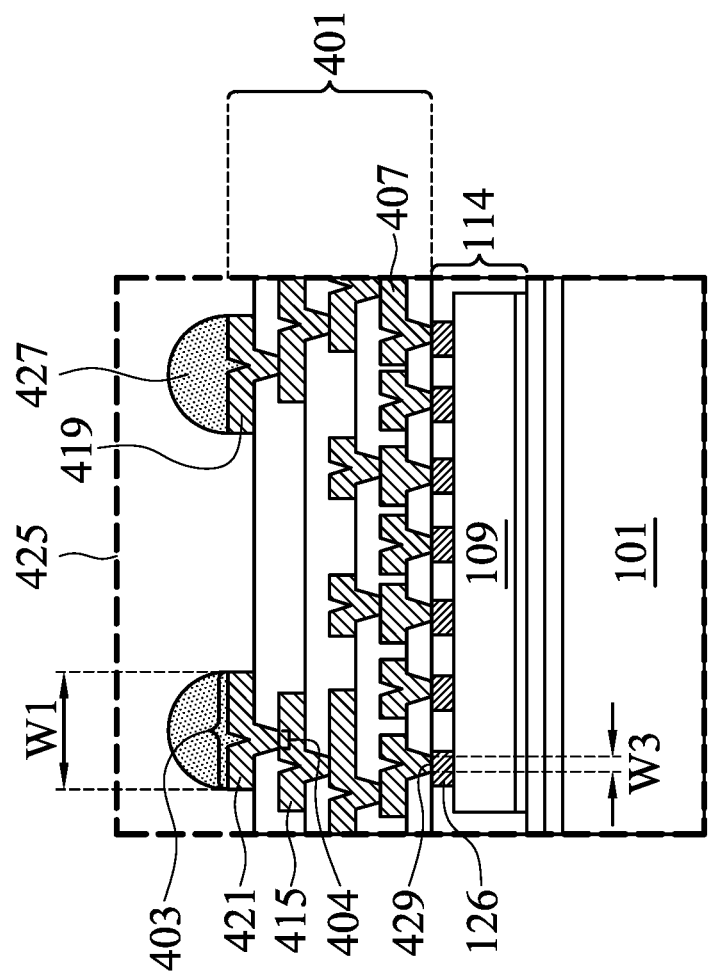
FIGS. 4B and 4C illustrate magnified views of regions of the intermediate structure of FIG. 4A, in accordance with some embodiments.

FIG. 4B illustrates a magnified view of the first region 425 of FIG. 4A. According to some embodiments, the first bumping area 421 is formed to the first width W1 such that the mechanical stress exerted on the third metallization pattern 415 is reduced. As such, the various thicknesses and widths of the bumping areas 403 of the fourth metallization pattern 419 allows the mechanical reliability of the front-side redistribution structure 401 to be increased. Furthermore, the first bumping area 421 has a concave shape contact area facing the conductive connectors 427 and a flat surface contact area 404 facing away from the conductive connectors 427. Furthermore, there is a first pad interface 429 located between the first metallization pattern 407 and a contact area of a die connector 126 of the first component 109 (e.g., the system-on-chip (SoC)) of the integrated circuit dies 114. The first pad interface 429 of the fourth metallization pattern 419 comprises a flat surface contact area 404 facing the die connector 126 of the first component 109 (e.g., the system-on-chip (SoC)) and a concave shape contact area facing away from the die connector 126. According to some embodiments, the first pad interface 429 has a third width W3 between about 10 µm and about 30 µm, such as about 20 µm. According to some embodiments, the front-side redistribution structure 401 comprises a first joint pad ratio R1 that may be determined from the formula: 10<R1=W1/W3<55.

Figure 4C:
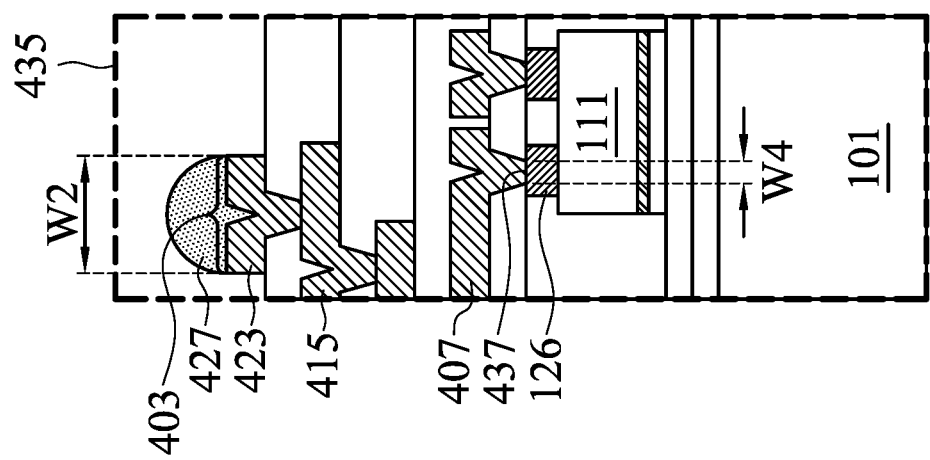

FIG. 4C illustrates a magnified view of the second region 435 of FIG. 4A. According to some embodiments, the second bumping area 423 is formed to the second width W2 such that the mechanical stress exerted on the third metallization pattern 415 is reduced. As such, the various thicknesses and widths of the bumping areas 403 of the fourth metallization pattern 419 allow the mechanical reliability of the front-side redistribution structure 401 to be increased. According to some embodiments, the second width W2 may be between about 150 µm and about 300 µm, such as about 200 µm.

Furthermore, there is a second pad interface 437 between the first metallization pattern 407 and a contact area of a die connector 126 of one of the second components 111 (e.g., integrated passive device (IPD)) of the integrated circuit dies 114. The second pad interface 437 of the first metallization pattern 407 comprises a flat surface contact area 404 facing the die connector 126 and a joint shape facing away from the die connector 126. According to some embodiments, the second pad interface 437 has a fourth width W4 between about 10 µm and about 30 µm, such as about 20 µm. In some embodiments, the front-side redistribution structure 401 comprises a second joint pad ratio R2 that may be determined from the formula: 5<R2=W2/W4<30.

Figure 5:
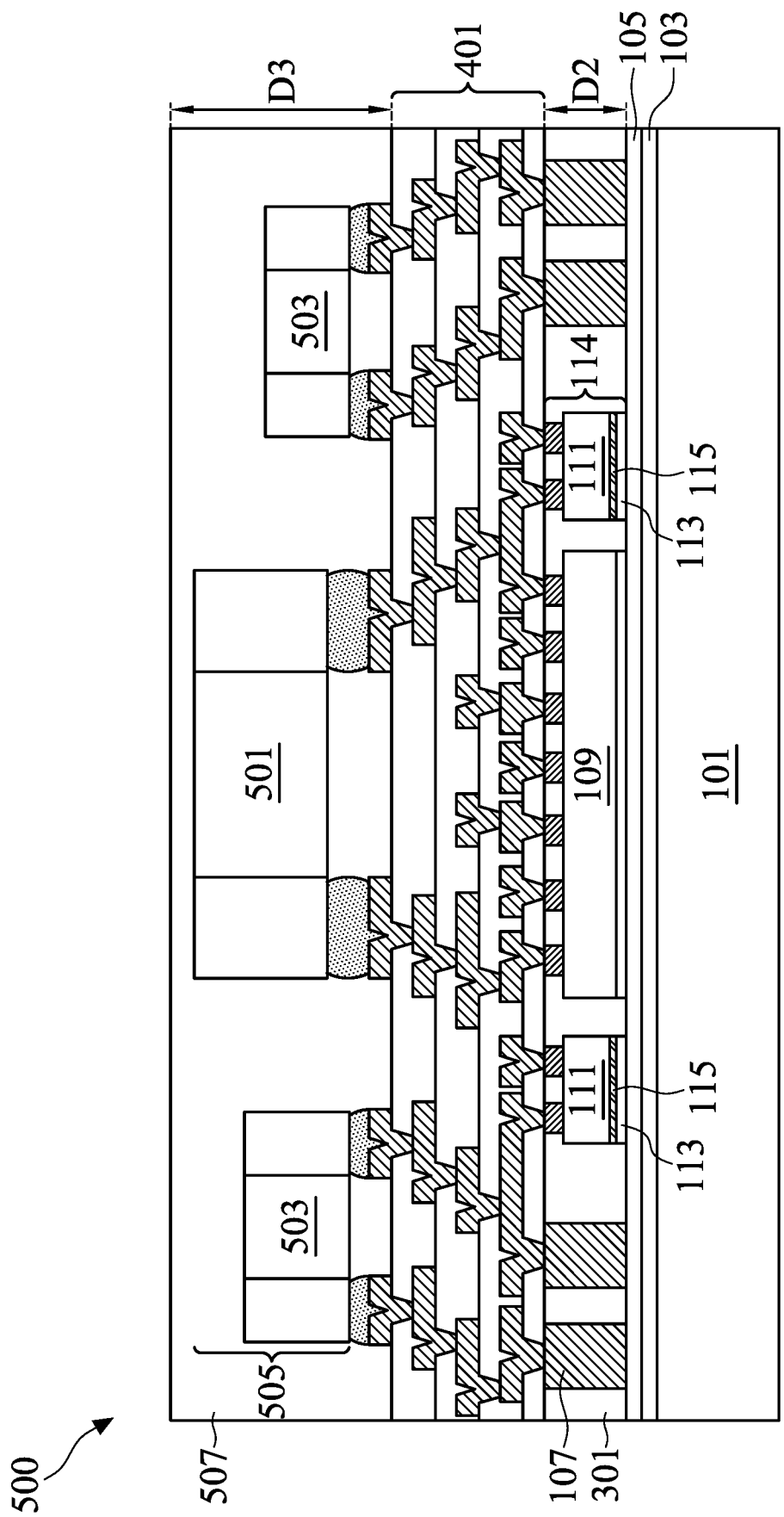
FIG. 5 illustrates the placement and encapsulation of integrated devices over the front-side redistribution structure of FIG. 4A in an intermediate step of forming the System-in-Package (SiP) device, in accordance with some embodiments.

FIG. 5 illustrates integrated devices 505 attached to the topmost metallization layer (e.g., the fourth metallization pattern 419) of the front-side redistribution structure 401 to make electrical connection to one or more of the integrated circuit dies 114 and/or one or more of the TIVs 107 at the opposite side of the front-side redistribution structure 401. The integrated devices 505 may be, for example, a semiconductor device or other device that includes one or more passive devices such as capacitors (e.g., a multi-layer ceramic capacitor (MLCC) 501), resistors, inductors, and the like. The integrated devices 505 may be, for example, integrated passive devices (IPDs), surface-mount devices (SMD) 503, or the like. The integrated devices 505 attached to the front-side redistribution structure 401 may be similar devices or may be different types of devices. FIG. 5 further illustrates the placement of three of the integrated devices 505, although more or fewer of the integrated devices 505 may be attached. The integrated devices 505 may be attached by, for example, sequentially dipping connectors (e.g., conductive bumps or pads) of the integrated devices 505 such as solder balls (not shown) into flux, and then using a pick-and-place tool in order to physically align the connectors of the integrated devices 505 with corresponding regions of the front-side redistribution structure 401. In some cases, a reflow process may be performed to bond the connectors of the integrated devices 505 to the conductive connectors 427.

In some embodiments, an optional underfill (not shown) is formed between each of the integrated devices 505 and the front-side redistribution structure 401, surrounding the connectors of the integrated devices 505. The optional underfill may reduce stress and protect the joints from damage resulting from the reflow process. The optional underfill may be formed by a capillary flow process after the integrated devices 505 are attached, or may be formed by a suitable deposition method before the integrated devices 505 are attached. In some embodiments in which a flux is used to attach the integrated devices 505, the flux may act as the optional underfill.

FIG. 5 further illustrates a second encapsulant 507 is formed over the front-side redistribution structure 401 to encapsulate the integrated devices 505. The second encapsulant 507 may be a molding compound, a molding underfill material, an epoxy, or the like, and may be applied by compression molding, transfer molding, or the like. According to some embodiments, the second encapsulant 507 has a first coefficient of thermal expansion CTE1, below a glass transition temperature of the second encapsulant 507, and has a second coefficient of thermal expansion CTE2, at or above the glass transition temperature of the second encapsulant 507. According to some embodiments, the second encapsulant 507 has a first coefficient of thermal expansion CTE1 of between about 8 ppm/K and about 30 ppm/K, such as about 9 ppm/K below a temperature of between about 157° C. and about 163° C., such as about 160° C. According to some embodiments, the second encapsulant 507 has a second coefficient of thermal expansion CTE2 of between about 15 ppm/K and about 40 ppm/K, such as about 25 ppm/K at or above a temperature of between about 157° C. and about 163° C., such as about 160° C. However, other suitable coefficients of thermal expansion may be used.

According to some embodiments, the first coefficient of thermal expansion CTE1 of the second encapsulant 507 may be different from the first coefficient of thermal expansion CTE1 of the first encapsulant 301. As such, the intermediate structure of FIG. 5 may be referred to herein as a first intermediate System-in-Package (SiP) structure 500, in which the first intermediate System-in-Package (SiP) structure 500 comprises a plurality of System-in-Package (SiP) components comprising asymmetric dual-sided moldings of a multi-layered redistribution layer (RDL) structure. In some embodiments, a first ratio (CTE-R1) of the first coefficient of thermal expansion CTE1 of the second encapsulant 507 to the first coefficient of thermal expansion CTE1 of the first encapsulant 301 may be between about 0.8≤CTE-R1≤0.99. Furthermore, a second ratio (CTE-R2) of the second coefficient of thermal expansion CTE2 of the second encapsulant 507 to the second coefficient of thermal expansion CTE2 of the first encapsulant 301 may be between about 0.1≤CTE-R2≤0.7, according to some embodiments.

After curing, the second encapsulant 507 can undergo a grinding process to reduce the height of the second encapsulant 507 to a third distance D3 from the topmost dielectric layer (e.g., the fourth dielectric layer 417). According to some embodiments, the third distance D3 is between about 200 µm and about 700 µm, such as about 550 µm. However, any suitable distance may be used. In some embodiments, the grinding may be omitted, for example, if the first encapsulant 301 is formed at the desired third distance D3. According to some embodiments, a ratio of the height of the second encapsulant 507 to a height of the first encapsulant 301 (e.g., D3/D2) may be between about 0≤D3/D2≤6.

Figure 6A:
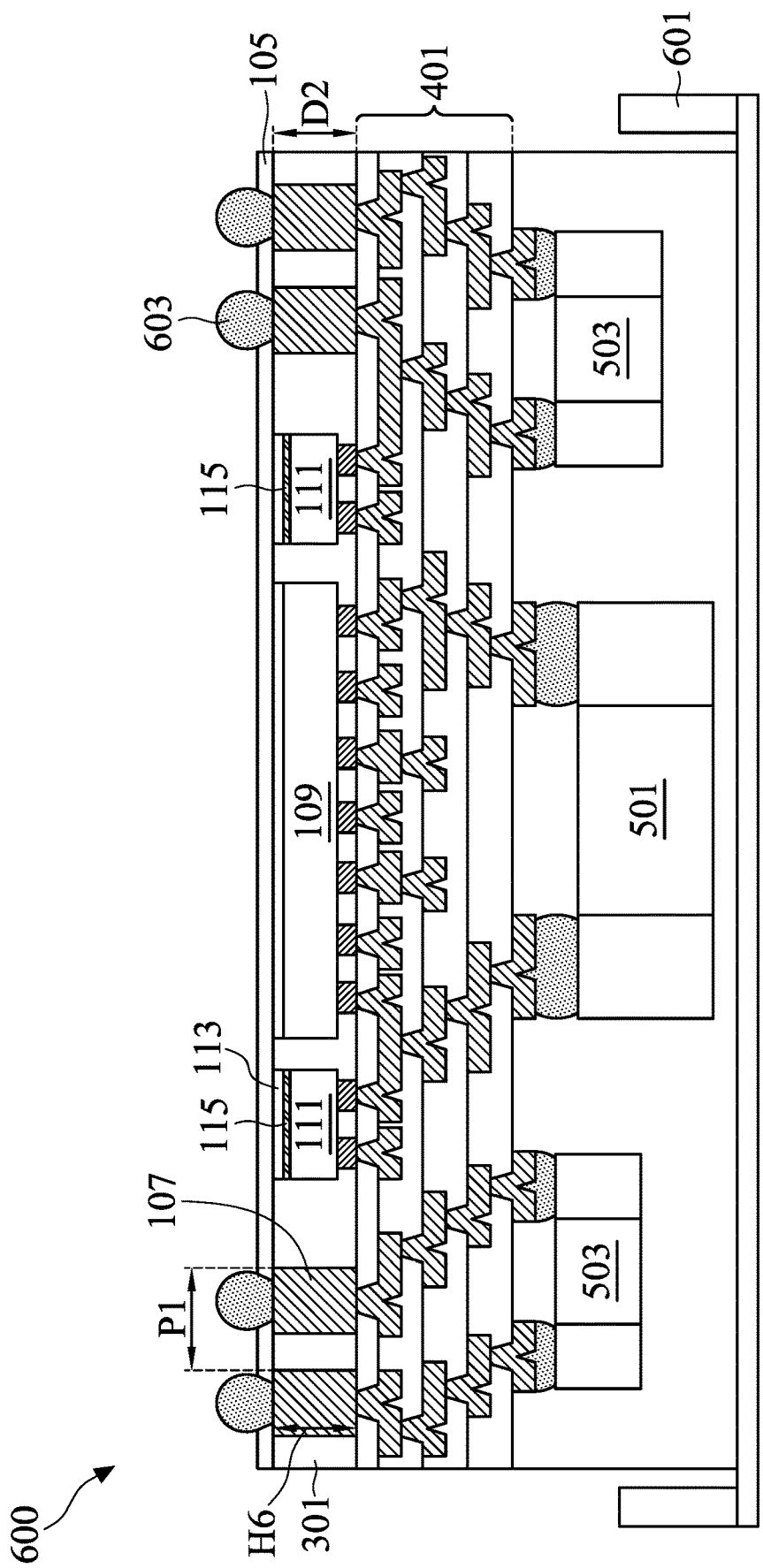
FIGS. 6A and 6B illustrate a de-bonding process of the carrier substrate from the structure in FIG. 5 and formation of external contacts over the TIVs in an intermediate step of forming the System-in-Package (SiP) device, in accordance with two embodiments.

Turning to FIG. 6A, this figure illustrates forming a first System-in-Package (SiP) device 600 formed from the first intermediate System-in-Package (SiP) structure 500. Initially, the first intermediate System-in-Package (SiP) structure 500 is flipped over and placed on a tape 601 for further processing. Once placed on the tape 601, a de-bonding process may be performed to detach (or "de-bond") the carrier substrate 101 from the front-side dielectric layer 105. In some embodiments, the de-bonding includes projecting a light such as a laser light or an UV light on the release layer 103 so that the release layer 103 decomposes under the heat of the light and the carrier substrate 101 can be removed.

As further illustrated in FIG. 6A, external connectors 603 may be formed for external connection to the first System-in-Package (SiP) device 600. Initially, openings may be formed through the front-side dielectric layer 105 to expose contact areas of the TIVs 107. The openings may be formed, for example, using laser drilling, etching, or the like. In such embodiments, the TIVs 107 may be formed to a sixth height H6 equal to the second distance D2. However, any suitable height may be used.

Once the contact areas of the TIVs 107 have been exposed, the external connectors 603 may be formed over the TIVs 107 making electrical connection to the front-side redistribution structure 401. In some embodiments, an optional solderability treatment (e.g., pre-soldering treatment) may be performed on the exposed contact areas of the TIVs 107 prior to forming the external connectors 603. The external connectors 603 may be deposited using similar process and similar materials used to form the conductive connectors 427 over the integrated redistribution layer (RDL) 801. According to some embodiments, the external connectors 603 are formed by initially forming a layer of pre-solder paste or solder on the exposed contact areas of the TIVs 107. However, any suitable process (e.g., evaporation, electroplating, printing, solder transfer, ball placement, or the like) may be used to form the pre-solder paste or solder on the exposed contact areas of the TIVs 107. In some embodiments, the external connectors 603 may be micro bumps. However, the external connectors 603 may also be ball grid array (BGA) connectors, solder balls, metal pillars, controlled collapse chip connection (C4) bumps, electroless nickel-electroless palladium-immersion gold technique (ENEPIG) formed bumps, or the like. The external connectors 603 may include a conductive material such as solder, copper, aluminum, gold, nickel, silver, palladium, tin, the like, or a combination thereof.

Once de-bonded from the carrier substrate, the first intermediate System-in-Package (SiP) structure 500 may be singulated (e.g., by sawing, by laser drill, by etching, by combinations thereof, and the like) into a plurality of the first System-in-Package (SiP) device 600. FIG. 6A further illustrates that the first System-in-Package (SiP) device 600 may be, for example, fabricated as a heterogeneous three-dimensional (3D) Fan-Out System-in-Package (SiP) device comprising external connectors (e.g., external connectors 603) having the first pitch P1 of between about 80 μm and about 250 μm, such as about 100 μm.

Figure 6B:
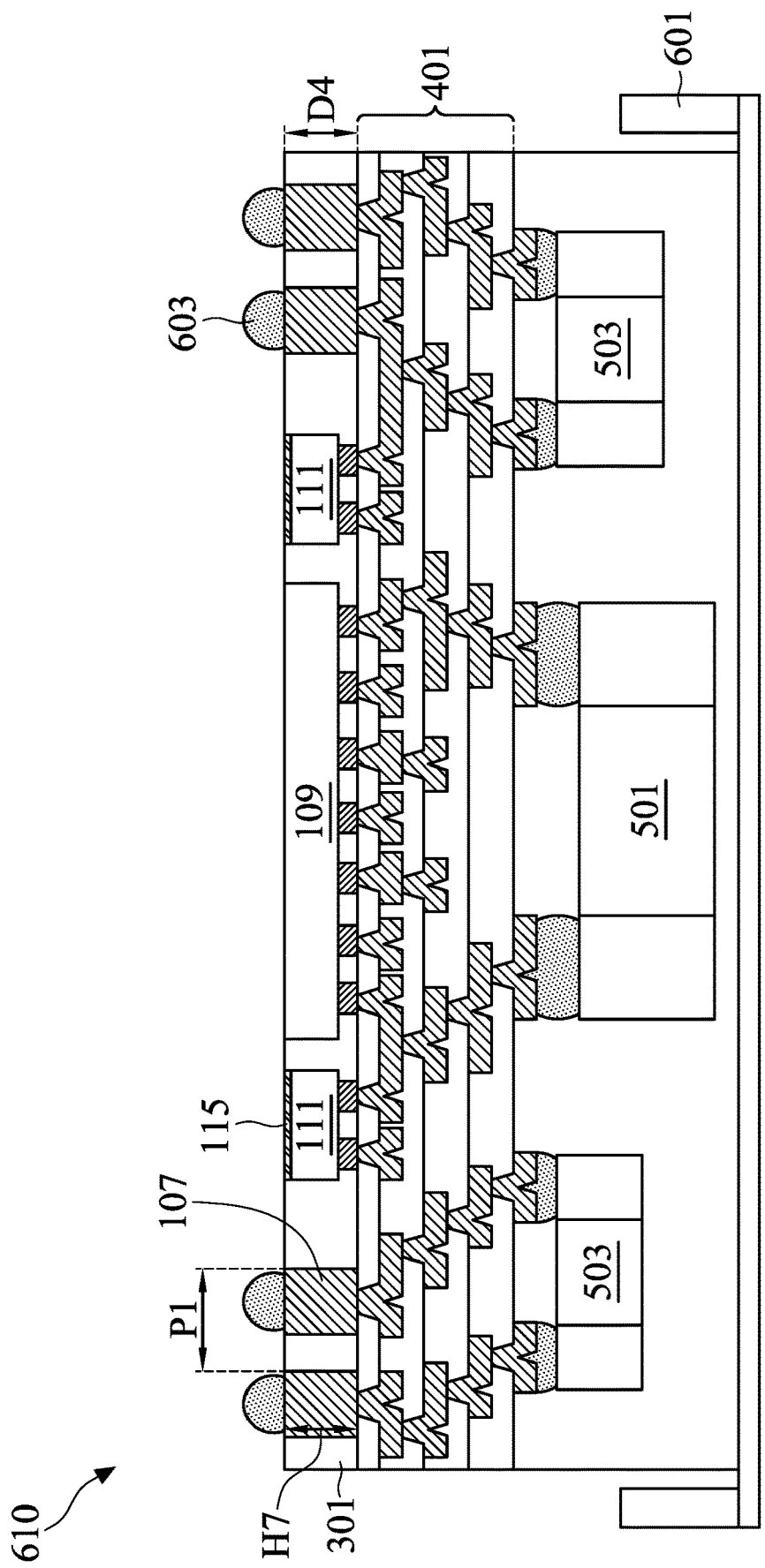

FIG. 6B illustrates a second System-in-Package (SiP) device 610, according to another embodiment. The second System-in-Package (SiP) device 610 differs from the first System-in-Package (SiP) device 600 of FIG. 6A in that the front-side dielectric layer 105 is also removed prior to forming external contacts over the TIVs 107. According to some embodiments, once the carrier substrate 101 has been removed, the front-side dielectric layer 105 is removed via a grinding process (e.g., chemical mechanical planarization (CMP)). The grinding process may be performed to remove the adhesive 113 and to planarize the TIVs 107, the first encapsulant 301, and the dam 115 of the one or more second components 111 with the backside of the first component 109 at a fourth distance D4 from the front-side redistribution structure 401. According to some embodiments, the fourth distance D4 is between about 85 μm and about 175 μm, such as about 115 μm. As such, the TIVs 107 are reduced to a seventh height H7 equal to the fourth distance D4. The grinding process may be followed by a cleaning process (e.g., DAF cleaning). As such, the TIVs 107 and the backside of the first component 109 are coplanar with and exposed at the surface of the first encapsulant 301 and are ready for further processing.

Once the contact areas of the TIVs 107 have been exposed, the external connectors 603 may be formed over the TIVs 107 making electrical connection to the front-side redistribution structure 401. The external connectors 603 may be formed over the TIVs 107 using any of the materials and methods described above with regards to FIG. 6A. However in other embodiments, the external connectors 603 are direct bonded over the TIVs 107 after the formation of optional contact pads (not shown) over the exposed TIVs 107. In a particular embodiment, after the TIVs 107 have been exposed through the first encapsulant 301, the contact pads are formed directly over and in physical connection with the exposed TIVs 107 and the external connectors 603 may be placed onto the contact pads. By direct bonding the external connectors 603 to the TIVs 107, the height and, hence, resistance of the TIVs 107 are reduced and the backside of the first component 109 (e.g., system-on-chip (SoC)) is exposed allowing heat from the first component 109 to escape from the second System-in-Package (SiP) device 610. FIG. 6B further illustrates that the second System-in-Package (SiP) device 610 may be, for example, a heterogeneous three-dimensional (3D) Fan-Out System-in-Package (SiP) structure comprising external connectors (e.g., external connectors 603) having the first pitch P1.

Figure 7A:
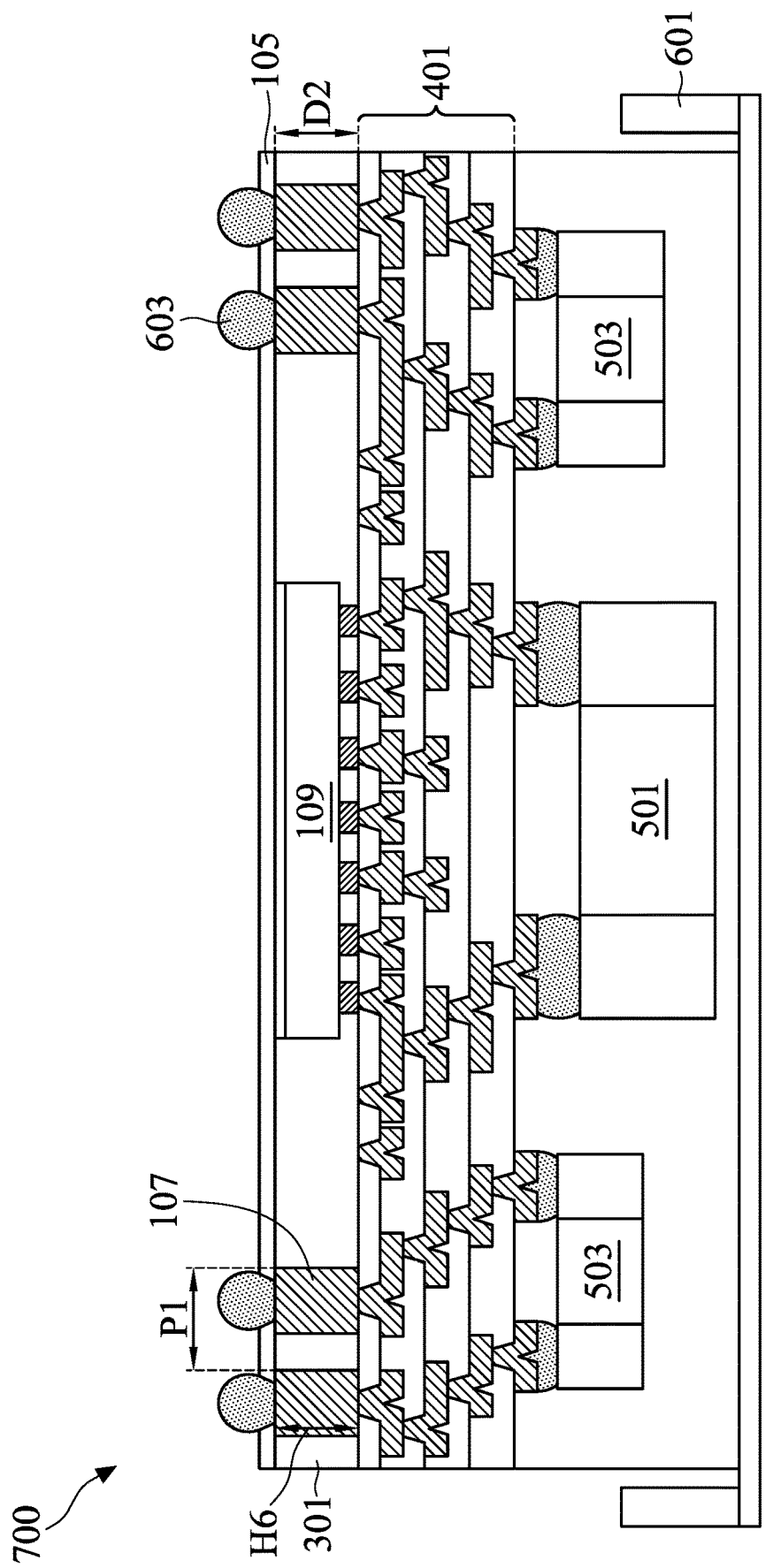
FIGS. 7A and 7B illustrate a de-bonding process of the carrier substrate from the structure in FIG. 5 and formation of external contacts over the TIVs in an intermediate step of forming the System-in-Package (SiP) device, in accordance with two other embodiments.
Figure 7B:
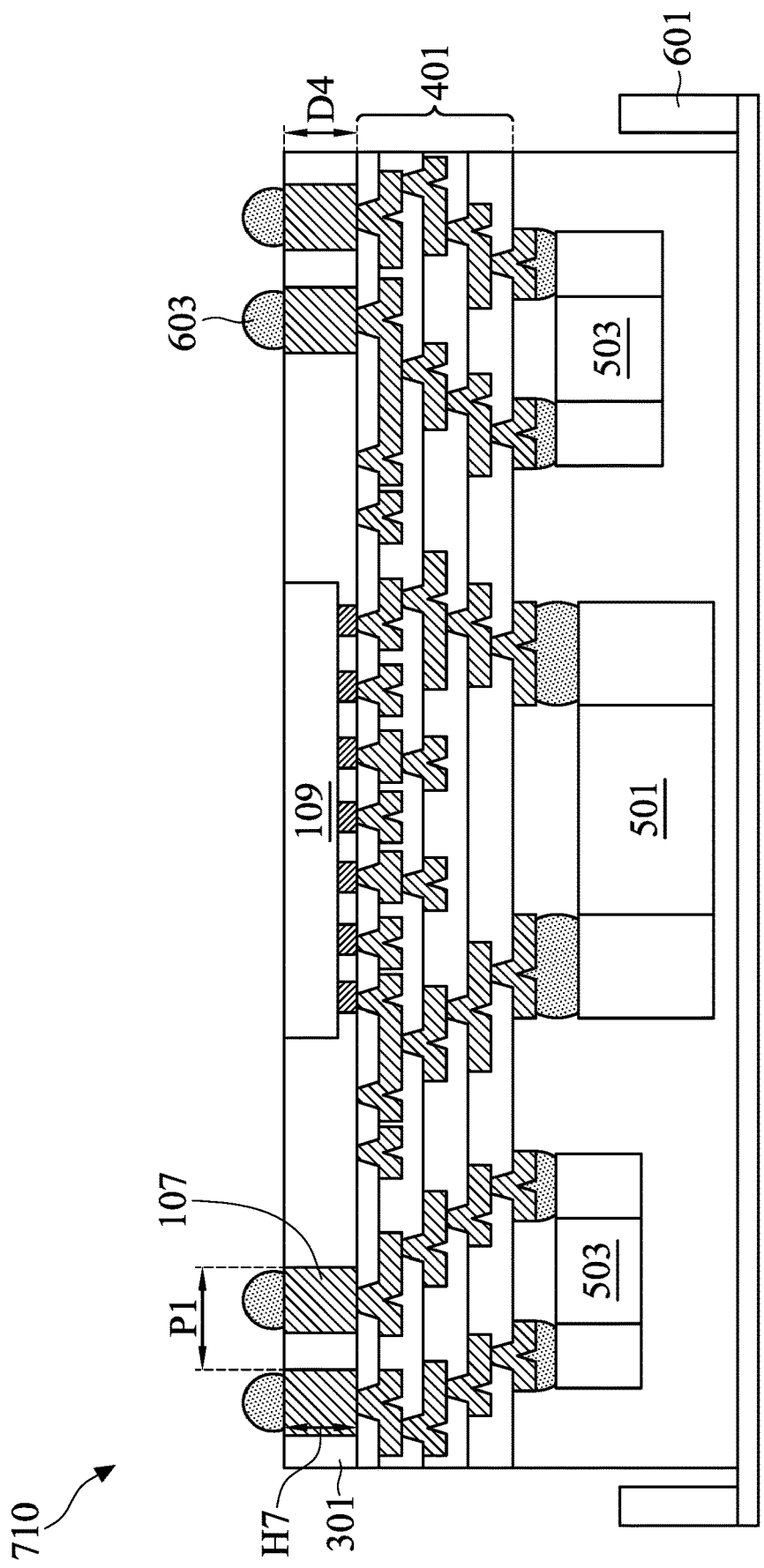

FIGS. 7A and 7B illustrate a third System-in-Package (SiP) device 700 and a fourth System-in-Package (SiP) device 710, respectively, according to other embodiments. The third System-in-Package (SiP) device 700 differs from the first System-in-Package (SiP) device 600 of FIG. 6A and the fourth System-in-Package (SiP) device 710 differs from the second System-in-Package (SiP) device 610 of FIG. 6B in that the one or more second components 111 are omitted in the third System-in-Package (SiP) device 700 and the fourth System-in-Package (SiP) device 710.

Figure 8A:
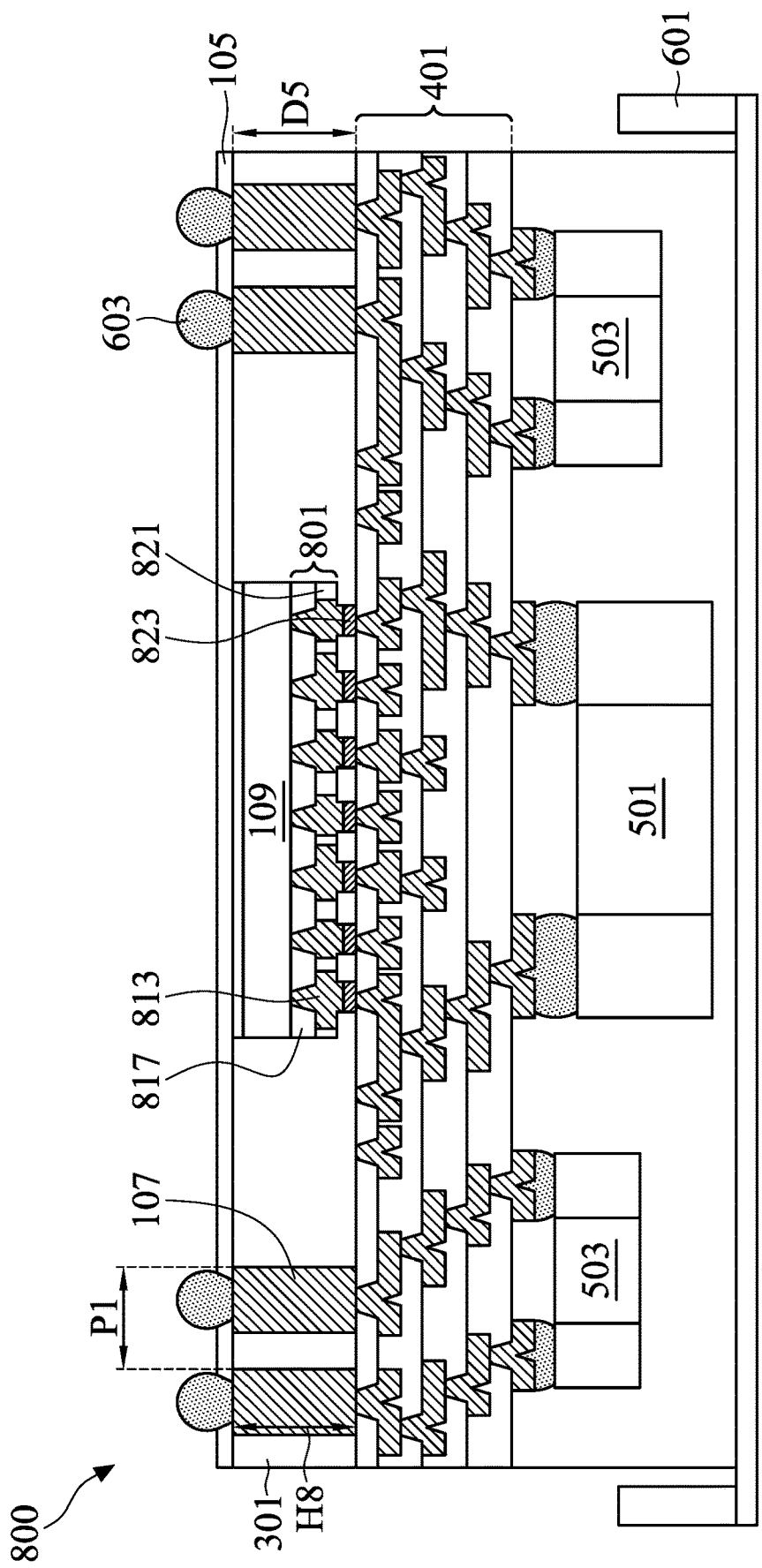
FIGS. 8A and 8B illustrate a de-bonding process of the carrier substrate from the structure in FIG. 5 and formation of external contacts over the TIVs in an intermediate step of forming the System-in-Package (SiP) device, in accordance with still two further embodiments.
Figure 8B:
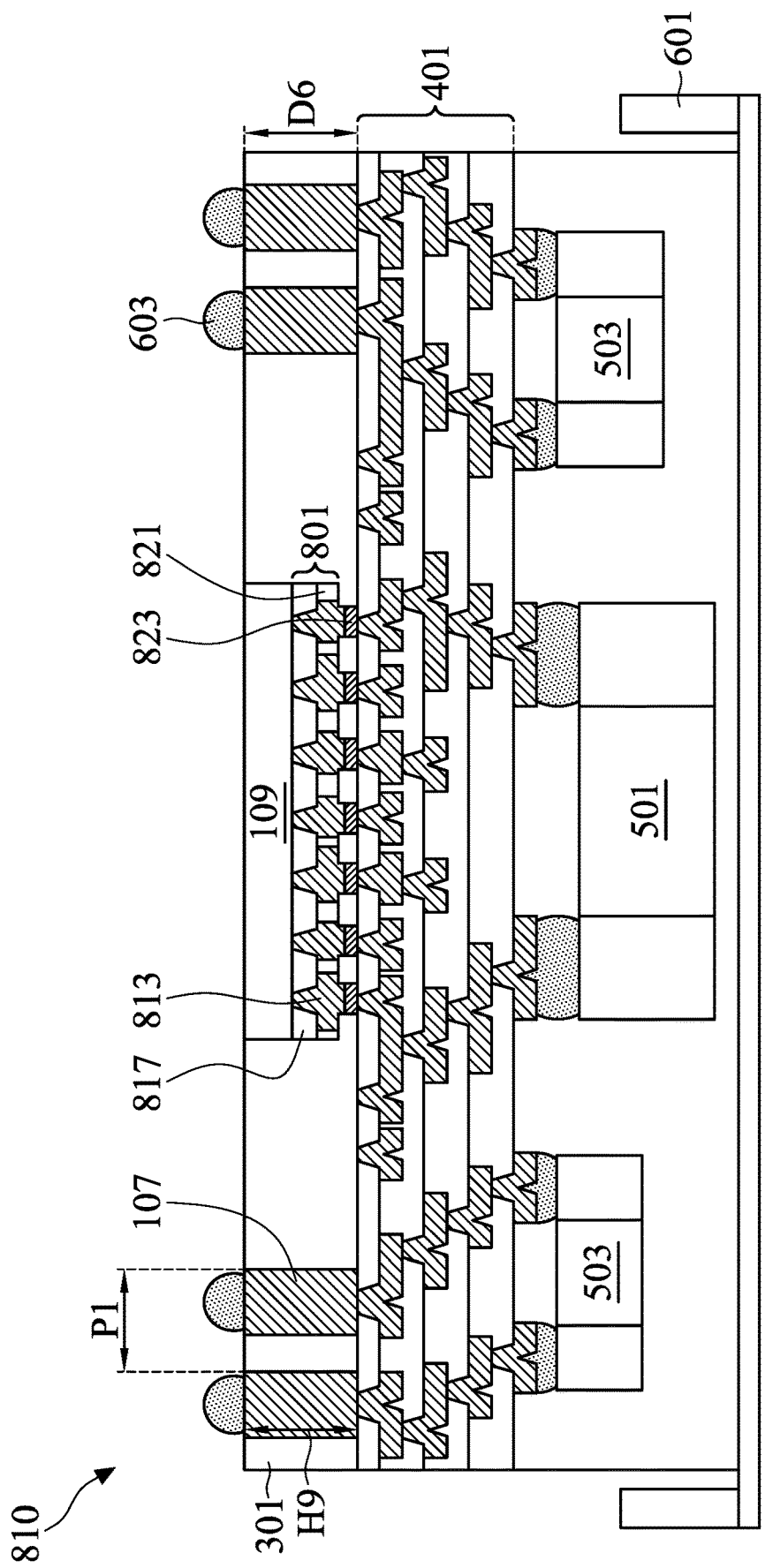

FIGS. 8A and 8B illustrate a fifth System-in-Package (SiP) device 800 and a sixth System-in-Package (SiP) device 810, respectively, according to still other embodiments. The fifth System-in-Package (SiP) device 800 and the sixth System-in-Package (SiP) device 810 differ from the third System-in-Package (SiP) device 700 of FIG. 7A and the fourth System-in-Package (SiP) device 710 of FIG. 7B, respectively, in that an integrated redistribution layer (RDL) 801 and micro-bumps 823 are used to couple the first component 109 to the front-side redistribution structure 401.

Initially, the first component 109 (e.g., system-on-chip (SoC)) may be formed according to applicable manufacturing processes in a wafer which may include different device regions that are tested and singulated in subsequent steps to form a plurality of known good dies (KGD). The integrated redistribution layer (RDL) 801 and micro-bumps 823 may be formed over the first component 109 to provide external connection to the first component 109. For example, the integrated redistribution layer (RDL) 801 may be electrically coupled to die pads (not shown) of the first component 109 and the micro-bumps 823 may be formed over contact areas of the integrated redistribution layer (RDL) 801.

The integrated redistribution layer (RDL) 801 may be formed, for example, as metallization patterns 813 in dielectric layers 817. The metallization patterns 813 include metal lines and vias formed in and/or over one or more of the dielectric layers 817 (e.g., low-K dielectric layers). The metallization patterns 813 and the dielectric layer 817 may be formed to any suitable thicknesses using any of the materials and processes suitable for forming the metallization patterns and dielectric layers of the front-side redistribution structure 401, as set forth above.

In some embodiments, a passivation film 821 may be formed over a topmost metallization pattern of the integrated redistribution layer (RDL) 801 and openings may be formed in the passivation film 821 to expose the contact areas of the integrated redistribution layer (RDL) 801. The passivation film 821 may be a polymer such as PBO, polyimide, BCB, or the like; a nitride such as silicon nitride or the like; an oxide such as silicon oxide, PSG, BSG, BPSG, or the like; the like, or a combination thereof. The passivation film 821 may be formed, for example, by spin coating, lamination, CVD, or the like.

The micro-bumps 823 may be formed over the contact areas of the integrated redistribution layer (RDL) 801, once the contact areas have been exposed. In some embodiments, the micro-bumps 823 may be formed using solder (e.g., solder balls, solder bumps, or the like) formed on the contact areas of the integrated redistribution layer (RDL) 801. The micro-bumps 823 allow external connection to the first component 109. In some other embodiments, the micro-bumps 823 are formed as conductive pillars (e.g., using a metal such as copper) that extend through the openings in the passivation film 821 and are physically and electrically coupled to respective contact areas of the integrated redistribution layer (RDL) 801. The micro-bumps 823 may be formed by, for example, plating, or the like.

As such, the fifth System-in-Package (SiP) device 800 illustrated in FIG. 8A and the sixth System-in-Package (SiP) device 810 illustrated in FIG. 8B may be formed with some different dimensions than the third System-in-Package (SiP) device 700 and the fourth System-in-Package (SiP) device 710, respectively. For example, in embodiments of the fifth System-in-Package (SiP) device 800, after the grinding process to planarize the first encapsulant 301 with the top surfaces of the TIVs 107 and the micro-bumps 823 (discussed above with regard to FIG. 3), the first encapsulant 301, the TIVs 107 and the micro-bumps 823 are coplanar at a fifth distance D5 from the front-side dielectric layer 105. Furthermore, the TIVs 107 of the fifth System-in-Package (SiP) device 800 have an eighth height H8 substantially equal to the fifth distance D5. According to some embodiments, the fifth distance D5 is between about 110 µm and about 210 µm, such as about 145 µm. However, any suitable distance may be used.

In embodiments of the sixth System-in-Package (SiP) device 810, after the grinding process to planarize the first encapsulant 301 with the top surfaces of the TIVs 107 and the micro-bumps 823 (discussed above with regard to FIG. 3) and to remove the adhesive 113, the first encapsulant 301, the TIVs 107 and the micro-bumps 823 are coplanar at a sixth distance D6 from the front-side dielectric layer 105. Furthermore, the TIVs 107 of the sixth System-in-Package (SiP) device 810 have a ninth height H9 substantially equal to the sixth distance D6. According to some embodiments, the sixth distance D6 is between about 90 µm and about 200 µm, such as about 135 µm. However, any suitable distance may be used.

According to embodiments disclosed herein, System-in-Package (SiP) devices may be fabricated using heterogeneous devices and asymmetric dual-side molding on a multi-layered redistribution layers (RDL) structure having a small profile that is formed using a single carrier substrate. As such, the System-in-Package (SiP) devices may be manufactured more efficiently and with fewer chances of defects.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, a method includes: depositing a first dielectric layer over a carrier substrate; adhering a first device to the first dielectric layer; encapsulating the first device in a first molding compound; forming an interconnect structure over the first device, wherein a first interface between the interconnect structure and the first device has a first shape; placing a second device over the interconnect structure, the interconnect structure electrically coupling the second device to the first device, wherein a second interface between the interconnect structure and the second device has a second shape different from the first shape; and encapsulating the second device in a second molding compound after the placing the second device over the interconnect structure. In an embodiment, a coefficient of thermal expansion of the second molding compound is different from a coefficient of thermal expansion of the first molding compound. In an embodiment, the coefficient of thermal expansion of the first molding compound is a first coefficient of thermal expansion below a glass transition temperature of the first molding compound and the coefficient of thermal expansion of the second molding compound is a first coefficient of thermal expansion of the second molding compound below a glass transition temperature of the second molding compound; and a ratio of the first coefficient of thermal expansion of the second molding compound to the first coefficient of thermal expansion of the first molding compound is between 0.8 and 0.99, inclusive. In an embodiment, the coefficient of thermal expansion of the first molding compound is a second coefficient of thermal expansion above the glass transition temperature of the first molding compound and the coefficient of thermal expansion of the second molding compound is a second coefficient of thermal expansion above the glass transition temperature of the second molding compound; and a ratio of the second coefficient of thermal expansion of the second molding compound to the second coefficient of thermal expansion of the first molding compound is between 0.1 and 0.7, inclusive. In an embodiment the method further includes: placing an integrated passive device over the carrier substrate, the integrated passive device being attached to a silicon dam; and leveling the integrated passive device and the first device. In an embodiment the first shape is a flat surface and the second shape is a concave shape. In an embodiment the concave shape has a first width and the flat surface has a second width and a ratio of the first width to the second width is between 3 and 7, inclusive.

In accordance with another embodiment, a method includes: depositing a first dielectric layer over a system on chip device; forming a first opening through the first dielectric layer, a first die connector of the system on chip device being exposed through the first opening; depositing a first metallization pattern over the first dielectric layer and in the first opening to the first die connector, a first flat contact area interface being formed between the first metallization pattern and the first die connector; depositing a second dielectric layer over the first metallization pattern; forming a second opening through the second dielectric layer; forming a second metallization pattern over the second dielectric layer and in the second opening; placing an integrated circuit device over the second metallization pattern; and attaching a contact area of the integrated circuit device to a surface of the second metallization pattern, the surface of the second metallization pattern being concave. In an embodiment the method further includes: encapsulating the system on chip device in a first molding compound prior to the depositing the first dielectric layer; and encapsulating the integrated circuit device in a second molding compound after the placing the integrated circuit device over the second metallization pattern. In an embodiment a ratio between a second height of the second molding compound and a first height of the first molding compound is at most 6. In an embodiment the method further includes forming a through via prior to the depositing the first dielectric layer over the system on chip device, wherein after the forming the through via the system on chip device is located adjacent to through via. In an embodiment the method further includes: forming a third opening, a first through interconnect via being exposed through the third opening, wherein the depositing the first metallization pattern over the first dielectric layer further comprises depositing the first metallization pattern in the third opening to the first through interconnect via. In an embodiment the method further includes: forming a first external connector to the first through interconnect via opposite the first metallization pattern; and forming a second external connector adjacent to the first external connector, a pitch between the first external connector and the second external connector being between 80 µm and 250 µm, inclusive. In an embodiment the surface of the second metallization pattern has a first width and the first flat contact area interface has a second width and a ratio of the first width to the second width is between 3 and 7, inclusive.

In accordance with still another embodiment, a semiconductor device, including: a system on chip device; an integrated circuit device; and a redistribution structure physically separating and electrically coupling the integrated circuit device and the system on chip device, wherein the redistribution structure comprises a first metal trace having a concave shape interface with the integrated circuit device and a second metal trace having a flat interface with the system on chip device. In an embodiment the concave shape interface has a first width and the flat interface has a second width, the second width being smaller than the first width. In an embodiment a ratio of the first width to the second width is between 3 and 7, inclusive. In an embodiment the semiconductor device further includes a first through interconnect via, wherein the redistribution structure further comprises a third metal trace having a second flat interface with the first through interconnect via. In an embodiment the semiconductor device further includes an integrated passive device adjacent to the system on chip device, the integrated passive device electrically connected to the redistribution structure and in physical contact with a dam on an opposite side of the integrated passive device from the redistribution structure. In an embodiment the semiconductor device further includes: a first molding compound encapsulating the system on chip device, the first molding compound having a first height; and a second molding compound encapsulating the integrated circuit device, the second molding compound having a second height, wherein a ratio of the second height to the first height is between 0 and 6, inclusive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a system on chip device;
    an integrated circuit device; and
    a redistribution structure physically separating and electrically coupling the integrated circuit device and the system on chip device, wherein the redistribution structure comprises a first metal trace having a concave surface, the concave surface facing the integrated circuit device, the concave surface of the first metal trace forming a concave shape interface with the integrated circuit device and a second metal trace having a flat interface with the system on chip device, wherein the concave shape interface has a first width and the flat interface has a second width, the second width being smaller than the first width.

2. The semiconductor device of claim 1, wherein a ratio of the first width to the second width is between 3 and 7, inclusive.

3. The semiconductor device of claim 1, further comprising a first through interconnect via, wherein the redistribution structure further comprises a third metal trace having a second flat interface with the first through interconnect via.

4. The semiconductor device of claim 3, further comprising an integrated passive device adjacent to the system on chip device, the integrated passive device electrically connected to the redistribution structure and in physical contact with a dam on an opposite side of the integrated passive device from the redistribution structure.

5. The semiconductor device of claim 1, further comprising:
    a first molding compound encapsulating the system on chip device, the first molding compound having a first height; and
    a second molding compound encapsulating the integrated circuit device, the second molding compound having a second height, wherein a ratio of the second height to the first height is between 0 and 6, inclusive.

6. A semiconductor device comprising:
    a first molding compound encapsulating a first device;
    an interconnect structure over the first device, wherein a first interface between the interconnect structure and the first device has a flat surface;
    a second device over the interconnect structure, the interconnect structure electrically coupling the second device to the first device, wherein a second interface between the interconnect structure and the second device has a concave shape, wherein the concave shape has a first width and the flat surface has a second width and a ratio of the first width to the second width is between 3 and 7, inclusive; and a second molding compound encapsulating the second device over the interconnect structure.

7. The semiconductor device of claim 6, wherein a coefficient of thermal expansion of the second molding compound is different from a coefficient of thermal expansion of the first molding compound.

8. The semiconductor device of claim 7, wherein the coefficient of thermal expansion of the first molding compound is a first coefficient of thermal expansion below a glass transition temperature of the first molding compound and the coefficient of thermal expansion of the second molding compound is a second coefficient of thermal expansion below a glass transition temperature of the second molding compound and a ratio of the second coefficient of thermal expansion to the first coefficient of thermal expansion is between 0.8 and 0.99, inclusive.

9. The semiconductor device of claim 8, wherein the coefficient of thermal expansion of the first molding compound is a third coefficient of thermal expansion above the glass transition temperature of the first molding compound and the coefficient of thermal expansion of the second molding compound is a fourth coefficient of thermal expansion above the glass transition temperature of the second molding compound and a ratio of the fourth coefficient of thermal expansion to the third coefficient of thermal expansion is between 0.1 and 0.7, inclusive.

10. The semiconductor device of claim 6, further comprising the first device attached to an adhesive, the adhesive attached to a first dielectric layer, and an integrated passive device attached to a silicon dam, the silicon dam attached to the adhesive, the adhesive attached to the first dielectric layer.

11. The semiconductor device of claim 10, wherein the integrated passive device and the first device are leveled to a same height from the first dielectric layer.

12. The semiconductor device of claim 10, further comprising through vias over the first dielectric layer.

13. The semiconductor device of claim 6, wherein the first molding compound has a first thickness, and the second molding compound has a second thickness, the second thickness being greater than the first thickness.

14. A semiconductor device comprising:
a first dielectric layer over a system on chip device;
a first metallization pattern over the first dielectric layer, a first portion of the first metallization pattern extending through the first dielectric layer to a first die connector of the system on chip device and a second portion of the first metallization pattern extending through the first dielectric layer to a through via;
a first flat contact area interface between the first metallization pattern and the first die connector, wherein the first flat contact area interface has a first width;
a second dielectric layer over the first metallization pattern;
a second metallization pattern over the second dielectric layer and extending through the second dielectric layer;
an integrated circuit device over the second metallization pattern; and
a contact area of the integrated circuit device to a surface of the second metallization pattern, wherein the surface of the second metallization pattern is concave, wherein the contact area has a second width, the first width being less than the second width.

15. The semiconductor device of claim 14, further comprising:
a first molding compound encapsulating the system on chip device; and
a second molding compound encapsulating the integrated circuit device.

16. The semiconductor device of claim 15, wherein a ratio between a second height of the second molding compound and a first height of the first molding compound is at most 6.

17. The semiconductor device of claim 15, wherein the first molding compound has a first coefficient of thermal expansion, and the second molding compound has a second coefficient of thermal expansion, the first coefficient of thermal expansion being different from the second coefficient of thermal expansion.

18. The semiconductor device of claim 14, wherein the system on chip device is located adjacent to the through via.

19. The semiconductor device of claim 14, further comprising:
a first external connector to the through via opposite the first metallization pattern; and
a second external connector adjacent to the first external connector, a pitch between the first external connector and the second external connector being between 80 µm and 250 µm, inclusive.

20. The semiconductor device of claim 14, wherein the surface of the second metallization pattern has a first width and the first flat contact area interface has a second width, a ratio of the first width to the second width is between 3 and 7, inclusive.

* * * * *